(12) United States Patent
Chen et al.

(10) Patent No.: US 11,882,751 B2
(45) Date of Patent: Jan. 23, 2024

(54) DISPLAY DEVICE AND METHOD FOR MANUFACTURING THE SAME

(71) Applicants: CHONGQING BOE DISPLAY TECHNOLOGY CO., LTD., Chongqing (CN); BOE TECHNOLOGY GROUP CO., LTD., Beijing (CN)

(72) Inventors: Dong Chen, Beijing (CN); Yaxin Yang, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 94 days.

(21) Appl. No.: 17/647,166

(22) Filed: Jan. 5, 2022

(65) Prior Publication Data
US 2022/0130912 A1    Apr. 28, 2022

Related U.S. Application Data

(63) Continuation of application No. 16/850,845, filed on Apr. 16, 2020, now Pat. No. 11,251,239.

(30) Foreign Application Priority Data

Nov. 8, 2019  (CN) .......................... 201911085672.6

(51) Int. Cl.
*H10K 59/40* (2023.01)
*H10K 50/87* (2023.01)
(Continued)

(52) U.S. Cl.
CPC ......... *H10K 59/40* (2023.02); *H10K 50/8426* (2023.02); *H10K 50/87* (2023.02);
(Continued)

(58) Field of Classification Search
CPC .... H10K 59/40; H10K 50/8426; H10K 50/87; H10K 59/131; H10K 71/00; H10K 59/1201
See application file for complete search history.

(56) References Cited

U.S. PATENT DOCUMENTS 9,276,055 B1 *  3/2016  Son ..................... H10K 50/844
2020/0057522 A1  2/2020  Hong et al.

* cited by examiner

*Primary Examiner* — Kyoung Lee
(74) *Attorney, Agent, or Firm* — Kinney & Lange, P.A.

(57) ABSTRACT

A bendable display device includes a display panel, a display circuit board having a first end thereof electrically connected to the display panel, a touch circuit board having a first end thereof electrically connected to the display panel, a support layer disposed on a surface of the display panel, and first and second heat dissipation layers. Each of the first heat dissipation layer and the second heat dissipation layer is disposed on a side of the support layer away from the display panel, and the first dissipation layer and the second dissipation layer are disposed on two sides of a bending area of the bendable display device. A second end of the display circuit board and a second end of the touch circuit board are respectively disposed on the first heat dissipation layer and the second heat dissipation layer. A connecting member for electrically connecting the first heat dissipation layer and the second heat dissipation layer is provided between the first heat dissipation layer and the second heat dissipation layer.

20 Claims, 4 Drawing Sheets

(51) Int. Cl.
 *H10K 50/842* (2023.01)
 *H10K 59/131* (2023.01)
 *H10K 71/00* (2023.01)
 *H10K 59/12* (2023.01)
(52) U.S. Cl.
 CPC ........... *H10K 59/131* (2023.02); *H10K 71/00* (2023.02); *H10K 59/1201* (2023.02)

DISPLAY DEVICE AND METHOD FOR MANUFACTURING THE SAME

CROSS-REFERENCE TO RELATED APPLICATION(S)

The present application is a continuation of U.S. application Ser. No. 16/850,845, filed Apr. 16, 2020, for "Display Device and Method for Manufacturing the Same", which claims the benefit of Chinese Patent Application No. 201911085672.6 filed on Nov. 8, 2019 in the State Intellectual Property Office of China, the whole disclosures of which are incorporated herein by reference.

TECHNICAL FIELD

The present disclosure relates to a field of display technology. More specifically, it relates to a display device and a method for manufacturing the same.

BACKGROUND

A market share of AMOLED display devices is getting higher and higher. At present, various brands have introduced a display design such as a notch, a water droplet, and a perforated display in order to achieve a higher screen ratio. However, with the popularization of 5G technology in the future, the existing size may not meet requirements of consumers, so large-screen displays may become a direction for a future development. Considering the portability of mobile communication devices and an excellent performance of flexible and bendable of AMOLED, foldable screens will definitely be more widely used in the future. In the AMOLED display device of the related art, a display circuit board and a touch circuit board are respectively attached to two independent heat dissipation layers. Such an arrangement may cause ground potentials of the display circuit board and the touch circuit board to be uneven, thereby damaging the display panel during a static electricity test.

SUMMARY

According to an aspect of the present disclosure, there is provided a display device, comprising:
a display panel;
a display circuit board, a first end of which being electrically connected to the display panel;
a touch circuit board, a first end of which being electrically connected to the display panel;
a support layer disposed on a surface of the display panel; and
a first heat dissipation layer and a second heat dissipation layer;
wherein, the first heat dissipation layer and the second heat dissipation layer are respectively disposed on both sides of a surface of the support layer facing away from the display panel, a second end of the display circuit board and a second end of the touch circuit board are respectively disposed on the first heat dissipation layer and the second heat dissipation layer, and a connecting member for electrically connecting the first heat dissipation layer and the second heat dissipation layer is provided between the first heat dissipation layer and the second heat dissipation layer.

In some embodiments, the connecting member comprises:
a third heat dissipation layer disposed on the surface of the support layer facing away from the display panel,
wherein the third heat dissipation layer is electrically connected to the first heat dissipation layer and the second heat dissipation layer, respectively.

In some embodiments, the first heat dissipation layer, the second heat dissipation layer, and the third heat dissipation layer are formed integrally.

In some embodiments, at least one of the first heat dissipation layer, the second heat dissipation layer, and the third heat dissipation layer is provided with a through hole, and a nut is provided in the through hole, and the nut passes through the through hole and is electrically connected to the support layer, and the first heat dissipation layer, the second heat dissipation layer, and the third heat dissipation layer have a same height which is not less than a height of the nut.

In some embodiments, the display device further comprises:
an adhesive layer,
wherein the adhesive layer is disposed on the surface of the support layer facing away from the display panel, and the first heat dissipation layer, the second heat dissipation layer, and the third heat dissipation layer are respectively fixed on the support layer through the adhesive layer, a sum of heights of the first heat dissipation layer and the adhesive layer, a sum of heights of the second heat dissipation layer and the adhesive layer, and a sum of heights of the third heat dissipation layer and the adhesive layer are the same and are not less than the height of the nut.

In some embodiments, a side of the third heat dissipation layer facing away from the display panel is provided with a jagged structure.

In some embodiments, the connecting member comprises:
a conductive tape,
wherein a first end of the conductive tape is electrically connected to the first heat dissipation layer, and a second end of the conductive tape is electrically connected to the second heat dissipation layer.

In some embodiments, the connecting member comprises:
a conductive adhesive,
wherein a material of the support layer is metal, and the conductive adhesive is disposed on both sides of the surface of the support layer facing away from the display panel, and is disposed between the first heat dissipation layer and the support layer and between the second heat dissipation layer and the support layer, respectively.

In some embodiments, the display device further comprises:
an adhesive layer,
wherein the adhesive layer is disposed on the surface of the support layer facing away from the display panel, and the first heat dissipation layer and the second heat dissipation layer are respectively fixed on the support layer through the adhesive layer.

In some embodiments, a material of the adhesive layer comprises EMBO.

According to another aspect of the present disclosure, there is provided a method for manufacturing a display device, comprising the following steps:
providing a display panel;
electrically connecting a first end of a display circuit board with the display panel;
electrically connecting a first end of a touch circuit board with the display panel;

forming a support layer on a surface of the display panel;
forming a first heat dissipation layer and a second heat dissipation layer on both sides of a surface of the support layer facing away from the display panel, respectively;
providing a second end of the display circuit board on the first heat dissipation layer and a second end of the touch circuit board on the second heat dissipation layer, respectively; and
providing a connecting member for electrically connecting the first heat dissipation layer and the second heat dissipation layer between the first heat dissipation layer and the second heat dissipation layer.

In some embodiments, the method further comprises:
forming a third heat dissipation layer on the surface of the support layer facing away from the display panel, wherein the third heat dissipation layer is configured to be electrically connected to the first heat dissipation layer and the second heat dissipation layer, respectively.

In some embodiments, the first heat dissipation layer, the second heat dissipation layer, and the third heat dissipation layer are formed integrally.

In some embodiments, the method further comprises: providing a through hole in at least one of the first heat dissipation layer, the second heat dissipation layer, and the third heat dissipation layer, and providing a nut passing through the through hole, so that the nut is electrically connected to the support layer by passing through the through hole, such that the first heat dissipation layer, the second heat dissipation layer, and the third heat dissipation layer have a same height which is not less than a height of the nut.

In some embodiments, the method further comprises:
providing an adhesive layer on the surface of the support layer facing away from the display panel, and fixing the first heat dissipation layer, the second heat dissipation layer, and the third heat dissipation layer onto the support layer through the adhesive layer, respectively, such that a sum of heights of the first heat dissipation layer and the adhesive layer, a sum of heights of the second heat dissipation layer and the adhesive layer, and a sum of heights of the third heat dissipation layer and the adhesive layer are the same and are not less than the height of the nut.

In some embodiments, the method further comprises: providing a jagged structure on a side of the third heat dissipation layer facing away from the display panel.

In some embodiments, the method further comprises: providing a conductive tape so that a first end of the conductive tape is electrically connected to the first heat dissipation layer, and a second end of the conductive tape is electrically connected to the second heat dissipation layer.

In some embodiments, a material of the support layer is metal, and the method comprises: disposing the conductive adhesive on both sides of the surface of the support layer facing away from the display panel, and between the first heat dissipation layer and the support layer and between the second heat dissipation layer and the support layer, respectively.

In some embodiments, the method further comprises: providing an adhesive layer on a surface of the support layer facing away from the display panel, so that the first heat dissipation layer and the second heat dissipation layer are respectively fixed onto the support layer through the adhesive layer.

BRIEF DESCRIPTION OF THE DRAWINGS

In order to explain the technical solutions in the embodiments of the present disclosure more clearly, the drawings used in the description of the embodiments are briefly introduced below. Obviously, the drawings in the following description are just some embodiments of the present disclosure. For those skilled in the art, other drawings can be obtained according to these drawings without an inventive effort.

DETAILED DESCRIPTION OF EMBODIMENTS

In order to make the technical solutions and advantages of the present disclosure more clear, the embodiments of the present disclosure will be described in further detail below with reference to the accompanying drawings.

Figure 1:
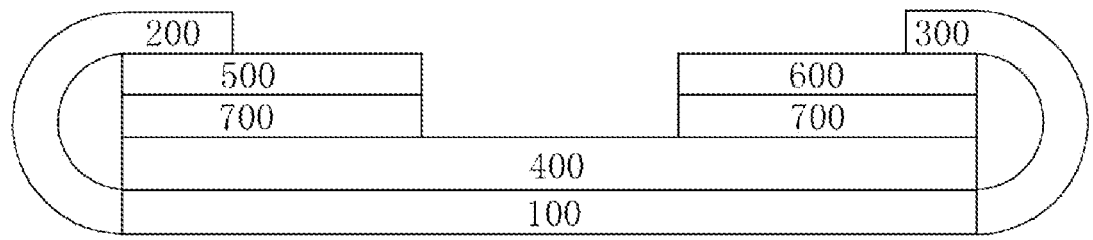
FIG. 1 shows a schematic diagram of a layer structure of a display device in the related art.

FIG. 1 shows a schematic diagram of a layer structure of a display device in the related art. In order to achieve foldability, the heat dissipation layer of an AMOLED display device is generally divided into two independent layers (the first heat dissipation layer 500 and the second heat dissipation layer 600 in FIG. 1). The display circuit board 200 and the touch circuit board 300 are respectively attached onto the two heat dissipation layers. Such an arrangement may cause the ground potentials of the display circuit board and the touch circuit board to be uneven, thereby damaging the display panel 100 during a static electricity test.

Figure 2:
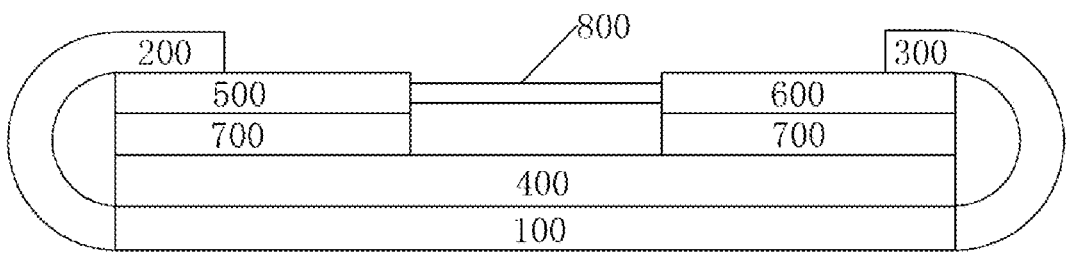
FIG. 2 shows a schematic diagram of a layer structure of a display device according to an embodiment of the present disclosure.

An embodiment of the present disclosure provides a display device. As shown in FIG. 2, the display device includes: a display panel 100, a display circuit board 200, a touch circuit board 300, a support layer 400, a first heat dissipation layer 500, and a second heat dissipation layer 600.

Specifically, in the example of FIG. 2, the display panel 100 may be a touch display panel 100, a first end of the display circuit board 200 is electrically connected to the display panel 100, and a first end of the touch circuit board 300 is electrically connected to the display panel 100. The support layer 400 is disposed on a surface of the display panel 100. In the example of FIG. 2, both sides of the support layer 400 are further provided with an adhesive layer 700. The first heat dissipation layer 500 and the second heat dissipation layer 600 are respectively fixed on the support layer 400 by the adhesive layers 700 provided on both sides of a surface of the support layer 400 facing away from the display panel 100. A second end of the display circuit board 200 and a second end of the touch circuit board 300 are respectively disposed on the first heat dissipation layer 500 and the second heat dissipation layer 600. It can be known from FIG. 2 that the second end of the display circuit board 200 and the second end of the touch circuit board 300 are respectively disposed on the first heat dissipation layer 500 and the second heat dissipation layer 600, while the first heat dissipation layer 500 and the second heat dissipation layer 600 are separated from each other. Therefore, the ground potentials of the display circuit board 200 and the touch circuit board 300 may be uneven, which may result in a damage to the display panel 100 during a static electricity test. In order to avoid this problem, in the example of FIG. 2, a connecting member is provided between the first heat dissipation layer 500 and the second heat dissipation layer 600. Here, the connecting member is mainly used to electrically connect the first heat dissipation layer 500 with the second heat dissipation layer 600, so as to further ensure that the display circuit board 200 and the touch circuit board 300 are electrically connected, so that the ground potentials of the display circuit board 200 and the touch circuit board 300 are the same, thereby preventing the display panel 100 from being damaged during a static electricity test.

In some optional implementations of this embodiment, the connecting member may further include:

a conductive tape 800;

a first end of the conductive tape 800 is electrically connected to the first heat dissipation layer 500, and a second end of the conductive tape 800 is electrically connected to the second heat dissipation layer 600.

Specifically, in the example of FIG. 2, the conductive tape 800 is disposed between the first heat dissipation layer 500 and the second heat dissipation layer 600. Since the first end of the conductive tape 800 is electrically connected to the first heat dissipation layer 500, and the second end of the conductive tape 800 is electrically connected to the second heat dissipation layer 600, so that the first heat dissipation layer 500 can achieve an indirect electrical connection with the second heat dissipation layer 600, thereby solving the problem of uneven ground potentials.

Figure 3:
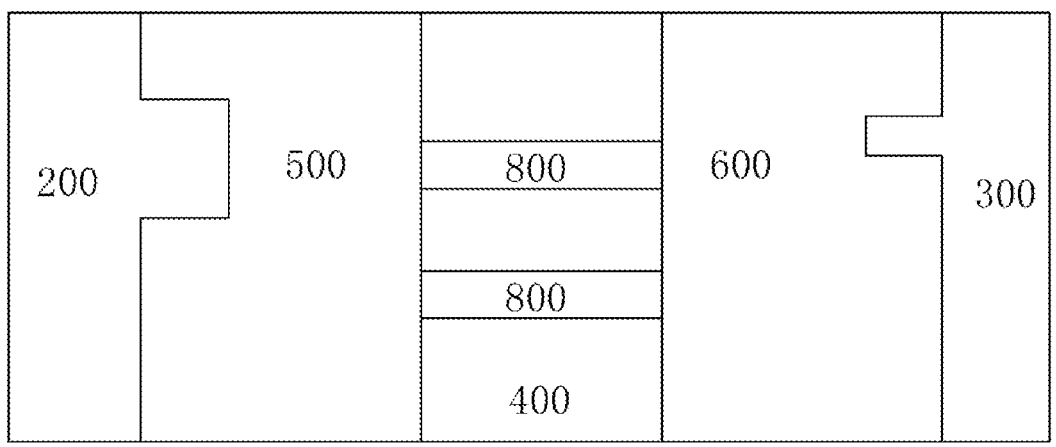
FIG. 3 shows a top view of a display device according to an embodiment of the present disclosure.

It should be noted that, in the example of FIG. 3, the number of the conductive tapes 800 is two. Those skilled in the art will know that the number of the conductive tapes 800 is not limited to two, and this implementation does not specifically limit the number.

In some optional implementations of this embodiment, the connecting member includes:

a conductive adhesive 900;

the material of the support layer 400 is metal, the conductive adhesive 900 is disposed on both sides of the surface of the support layer 400 facing away from the display panel 100, the first heat dissipation layer 500 and the second heat dissipation layers 600 are respectively disposed on the conductive adhesives 900 on both sides of the surface of the support layer 400 facing away from the display panel 100.

Figure 4:
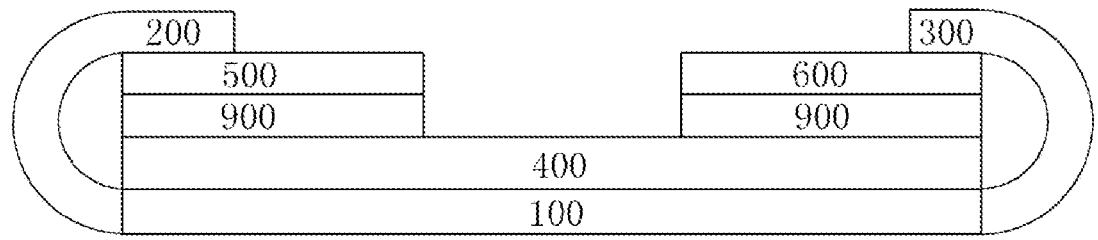
FIG. 4 shows a schematic diagram of a layer structure of a display device according to an embodiment of the present disclosure.

Specifically, as shown in FIG. 4, the conductive adhesive 900 is disposed on the support layer 400, and the first heat dissipation layer 500 and the second heat dissipation layer 600 are respectively disposed on the conductive adhesive 900. The conductive adhesive 900 is conductive, and the first heat dissipation layer 500 and the second heat dissipating layer 600 can realize an indirect electrical connection through the conductive adhesive 900, thereby solving the problem of uneven ground potentials, and because the conductive adhesive 900 has a certain viscosity, the conductive adhesive 900 can be used to replace the adhesive layer 700. The first heat dissipation layer 500 and the second heat dissipation layer 600 may be adhered to the support layer 400 through a conductive adhesive 900. The conductive adhesive 900 is, for example, an anisotropic conductive film (ACF).

In some optional implementations of this embodiment, the connecting member includes:

a third heat dissipation layer 1000;

the third heat dissipation layer 1000 is electrically connected to the first heat dissipation layer 500 and the second heat dissipation layer 600, respectively.

Figure 5:
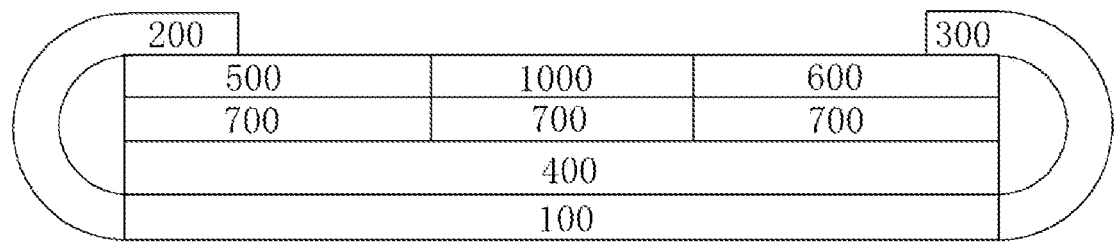
FIG. 5 shows a schematic diagram of a layer structure of a display device according to an embodiment of the present disclosure.

Specifically, in the example of FIG. 5, the third heat dissipation layer 1000 is located between the first heat dissipation layer 500 and the second heat dissipation layer 600, and since the third heat dissipation layer 1000 is connected to the first heat dissipation layer 500 and the second heat dissipation layer 600, respectively, so that the first heat dissipation layer 500 can achieve an indirect electrical connection with the second heat dissipation layer 600, thereby solving the problem of uneven ground potentials.

Further, the first heat dissipation layer 500, the second heat dissipation layer 600, and the third heat dissipation layer 1000 are integrally formed.

Specifically, the first heat dissipation layer 500, the second heat dissipation layer 600, and the third heat dissipation layer 1000 may be integrally formed, that is, the first heat dissipation layer 500, the second heat dissipation layer 600, and the third heat dissipation layer 1000 may be formed to be unitary.

Figure 6:
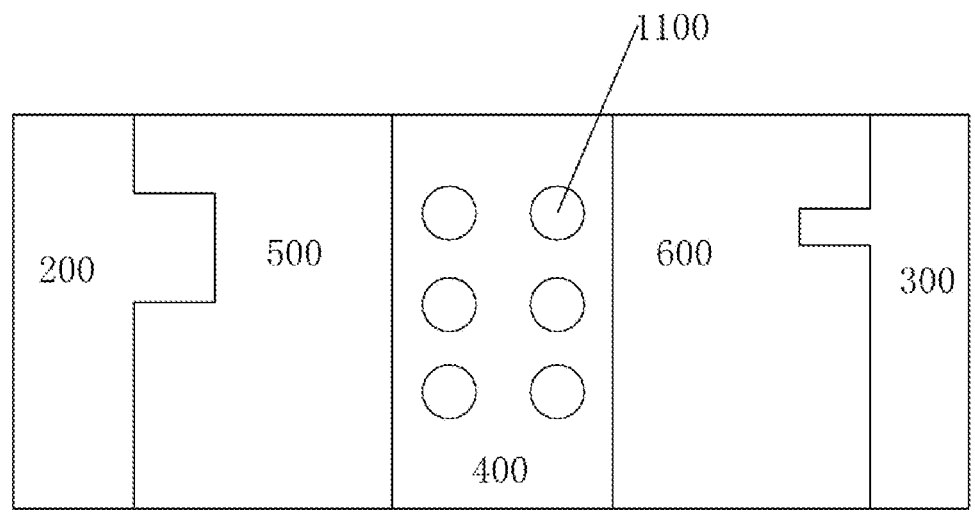
FIG. 6 shows a top view of a display device in the related art.
Figure 7:
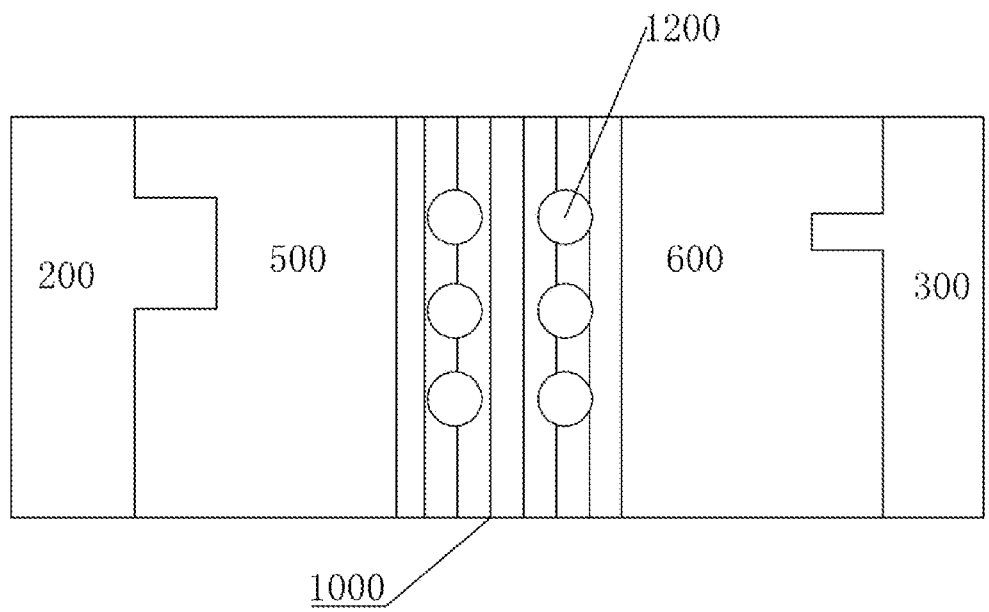
FIG. 7 shows a top view of a display device according to an embodiment of the present disclosure.

It should be noted that, as shown in FIG. 6, when the display device is produced, a nut 1100 for hinge is often welded on the support layer 400, which may cause the surface of the display device component to be uneven, and which is not conducive to a further attachment. Therefore, in order to solve this technical problem, in some optional implementations of this embodiment, as shown in FIG. 7, the first heat dissipation layer 500, the second heat dissipation layer 600, and/or the third heat dissipation layer 1000 are/is provided with a through hole 1200, and a nut 1100 is passed through the through hole 1200. The nut 1100 is electrically connected to the support layer 400 by passing through the through hole 1200, and the first heat dissipation layer 500, the second heat dissipation layer 600 and the third heat dissipation layer 1000 have the same height which is not less than the height of the nut 1100.

Specifically, the specific position of the through hole 1200 can be set according to actual requirement. In the example of FIG. 7, the through hole 1200 is located in the third heat dissipation layer 1000, and the nut 1100 can pass through the through hole 1200 and be electrically connected to the support layer 400. Further, the first heat dissipation layer 500, the second heat dissipation layer 600, and the third heat dissipation layer 1000 have the same height which is not less than the height of the nut 1100, thereby ensuring that the surface of the display device is flat and eliminating an adverse effect on the further attachment of the display device caused by welding the nut. It should be understood that, in the example of FIG. 7, the number of the through holes 1200 is six. Those skilled in the art will know that the number of the through holes 1200 is not limited to this. The embodiments do not specifically limit the number.

Figure 8:
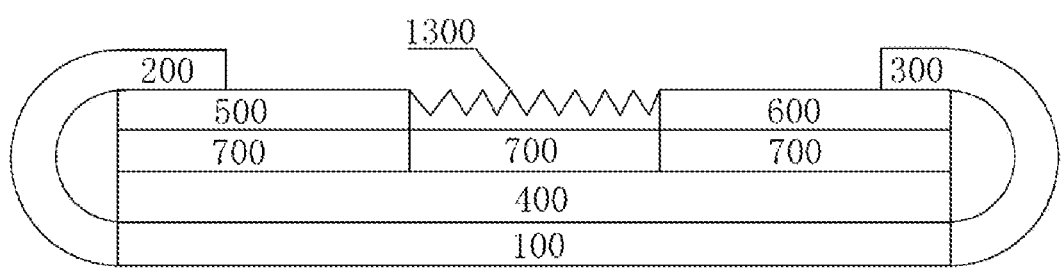
FIG. 8 shows a schematic diagram of a layer structure of a display device according to an embodiment of the present disclosure.

Further, when the first heat dissipation layer 500, the second heat dissipation layer 600, and the third heat dissipation layer 1000 are integrally formed, the bending property of the display device is correspondingly weakened. Therefore, in order to eliminate this effect, as shown in FIG. 8, in this embodiment, the third heat dissipation layer 1000 is provided with a jagged structure 1300. Specifically, the third heat dissipation layer 1000 has a jagged structure 1300 which correspondingly reduces the thickness of a part of the third heat dissipation layer 1000, thereby improving the bendability of the display device.

In some optional implementations of this embodiment, the connecting member further includes:

an adhesive layer 700;

the adhesive layer 700 is disposed on the surface of the support layer 400 facing away from the display panel 100, and the first heat dissipation layer 500 and the second heat dissipation layer 600 are respectively fixed onto the support layer 400 through the adhesive layer 700.

Specifically, as shown in FIG. 8, the material of the adhesive layer 700 includes EMBO. The first heat dissipation layer 500, the second heat dissipation layer 600, and the third heat dissipation layer 1000 may be respectively fixed onto the support layer 400 through the adhesive layer 700.

It should be noted that, when the connecting member disposed between the first heat dissipation layer 500 and the second heat dissipation layer 600 is the aforementioned conductive adhesive 900, the conductive adhesive 900 may be the adhesive layer 700 in the present implementation. When the first heat dissipation layer 500, the second heat dissipation layer 600, and the third heat dissipation layer 1000 are integrally formed, and the first heat dissipation layer 500, the second heat dissipation layer 600, and the third heat dissipation layer 1000 are all attached on the support layer 400 through the adhesive layer 700, the sum of the heights of the first heat dissipation layer 500 and the adhesive layer 700, the sum of the heights of the second heat dissipation layer 600 and the adhesive layer 700, and the sum of the heights of the third heat dissipation layer 1000 and the adhesive layer 700 are the same and are not less than the height of the nut 1100.

Further, the display device proposed in this embodiment may be an AMOLED display device.

Figure 9:
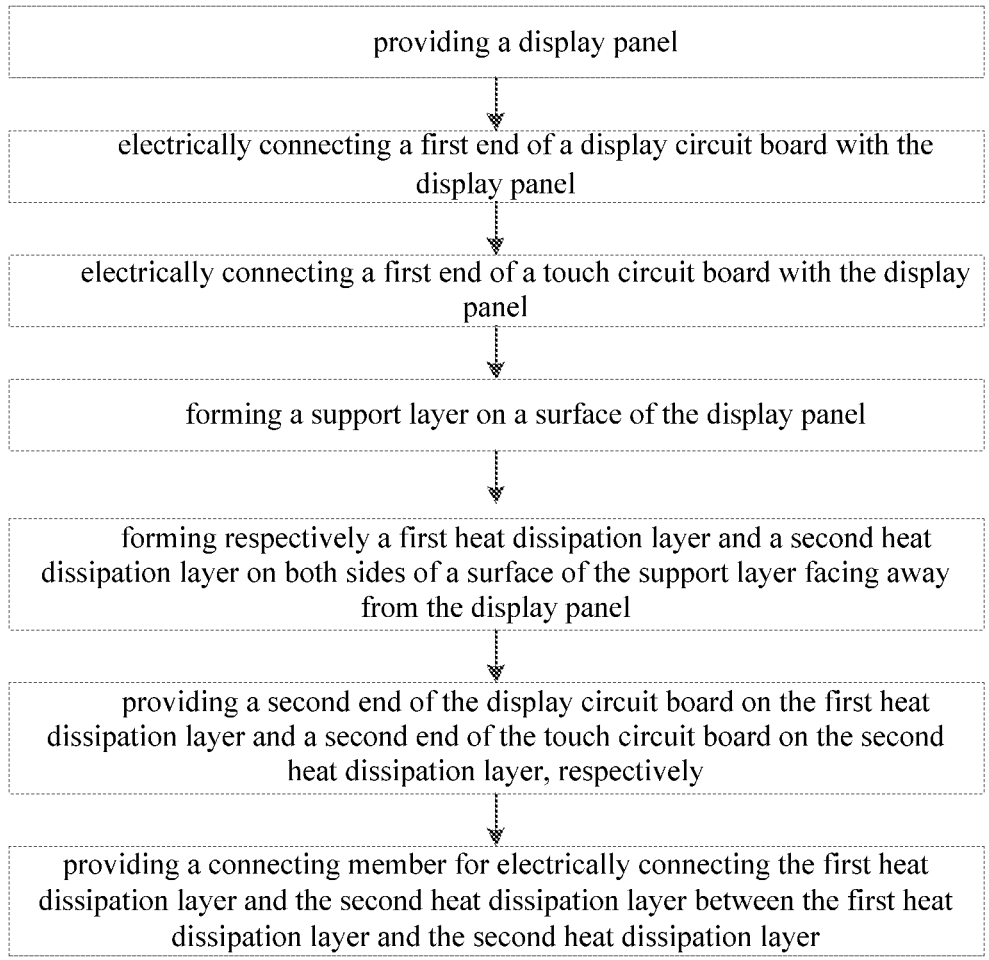
FIG. 9 shows a flowchart of a method for manufacturing a display device according to another embodiment of the present disclosure.

Another embodiment of the present disclosure provides a method for manufacturing a display device. As shown in FIG. 9, the method includes the following steps:

providing a display panel 100;

electrically connecting the first end of the display circuit board 200 with the display panel 100;

electrically connecting the first end of the touch circuit board 300 with the display panel 100;

forming a support layer 400 on the surface of the display panel 100;

forming a first heat dissipation layer 500 and a second heat dissipation layer 600 on both sides of the surface of the support layer 400 facing away from the display panel 100, respectively;

providing the second end of the display circuit board 200 and the second end of the touch circuit board 300 on the first heat dissipation layer 500 and the second heat dissipation layer 600, respectively;

providing a connecting member for electrically connecting the first heat dissipation layer 500 and the second heat dissipation layer 600 between the first heat dissipation layer 500 and the second heat dissipation layer 600.

The technical solution described in the present disclosure has the advantages of a clear principle and a simple design. By providing a connecting member between the first heat dissipation layer and the second heat dissipation layer, an electrical connection between the display circuit board and the touch circuit board is further ensured, so as to make the ground potentials of the display circuit board and the touch circuit board the same, avoiding the display panel being damaged during a static electricity test to the display device, and improving the safety.

Obviously, the above-mentioned embodiments of the present disclosure are merely examples for clearly explaining the present disclosure, and are not intended to limit the embodiments of the present disclosure. For those skilled in the art, based on the above description, there are other different forms of modifications or changes, and all implementations cannot be listed here. Any obvious modifications or changes that may be developed from the technical solutions of the present disclosure are still within the protection scope of the present disclosure.

What is claimed is:

1. A bendable display device, comprising:
a display panel;
a display circuit board, a first end thereof being electrically connected to the display panel;
a touch circuit board, a first end thereof being electrically connected to the display panel;
a support layer disposed on a surface of the display panel; and
a first heat dissipation layer and a second heat dissipation layer;
wherein, each of the first heat dissipation layer and the second heat dissipation layer is disposed on a side of the support layer away from the display panel, and the first heat dissipation layer and the second heat dissipation layer are disposed on two sides of a bending area of the bendable display device, a second end of the display circuit board and a second end of the touch circuit board are respectively disposed on the first heat dissipation layer and the second heat dissipation layer, and a connecting member for electrically connecting the first heat dissipation layer and the second heat dissipation layer is provided between the first heat dissipation layer and the second heat dissipation layer.

2. The bendable display device according to claim 1, wherein the connecting member comprises:
a third heat dissipation layer disposed on the surface of the support layer facing away from the display panel,
wherein the third heat dissipation layer is electrically connected to the first heat dissipation layer and the second heat dissipation layer, respectively.

3. The bendable display device according to claim 2, wherein the first heat dissipation layer, the second heat dissipation layer, and the third heat dissipation layer are formed integrally.

4. The bendable display device according to claim 3, wherein at least one of the first heat dissipation layer, the second heat dissipation layer, or the third heat dissipation layer is provided with a through hole, a nut is provided in the through hole, the nut passes through the through hole and is electrically connected to the support layer, and the first heat dissipation layer, the second heat dissipation layer, and the third heat dissipation layer have a same height which is not less than a height of the nut.

5. The bendable display device according to claim 4, further comprising:
an adhesive layer,
wherein the adhesive layer is disposed on the surface of the support layer facing away from the display panel, and the first heat dissipation layer, the second heat dissipation layer, and the third heat dissipation layer are respectively fixed on the support layer through the adhesive layer, and wherein a sum of heights of the first heat dissipation layer and the adhesive layer, a sum of heights of the second heat dissipation layer and the adhesive layer, and a sum of heights of the third heat dissipation layer and the adhesive layer are the same and are not less than the height of the nut.

6. The bendable display device according to claim 4, wherein a side of the third heat dissipation layer facing away from the display panel is provided with a jagged structure.

7. The bendable display device according to claim 1, wherein the connecting member comprises:
a conductive tape,
wherein a first end of the conductive tape is electrically connected to the first heat dissipation layer, and a second end of the conductive tape is electrically connected to the second heat dissipation layer.

8. The bendable display device according to claim 1, wherein the connecting member comprises:
a conductive adhesive,
wherein a material of the support layer is metal, and the conductive adhesive is disposed on both sides of the surface of the support layer facing away from the display panel, and is disposed between the first heat dissipation layer and the support layer and between the second heat dissipation layer and the support layer, respectively.

9. The bendable display device according to claim 1, further comprising:
an adhesive layer,
wherein the adhesive layer is disposed on the surface of the support layer facing away from the display panel, and the first heat dissipation layer and the second heat dissipation layer are respectively fixed on the support layer through the adhesive layer.

10. The bendable display device according to claim 1, wherein a material of the adhesive layer comprises EMBO.

11. A bendable display device, comprising:
a display panel;
a support layer disposed on a surface of the display panel; and
a first heat dissipation layer and a second heat dissipation layer;
wherein, each of the first heat dissipation layer and the second heat dissipation layer is disposed on a side of the support layer away from the display panel, the first heat dissipation layer and the second heat dissipation layer are disposed on two sides of a bending area of the bendable display device, and a connecting member for electrically connecting the first heat dissipation layer and the second heat dissipation layer is provided between the first heat dissipation layer and the second heat dissipation layer.

12. The bendable display device according to claim 11, wherein the connecting member comprises:
a third heat dissipation layer disposed on the surface of the support layer facing away from the display panel,
wherein the third heat dissipation layer is electrically connected to the first heat dissipation layer and the second heat dissipation layer, respectively.

13. The bendable display device according to claim 12, wherein the first heat dissipation layer, the second heat dissipation layer, and the third heat dissipation layer are formed integrally.

14. The bendable display device according to claim 13, wherein at least one of the first heat dissipation layer, the second heat dissipation layer, and the third heat dissipation layer is provided with a through hole, and a nut is provided in the through hole, and the nut passes through the through hole and is electrically connected to the support layer, and the first heat dissipation layer, the second heat dissipation layer, and the third heat dissipation layer have a same height which is not less than a height of the nut.

15. The bendable display device according to claim 14, further comprising:
an adhesive layer,
wherein the adhesive layer is disposed on the surface of the support layer facing away from the display panel, and the first heat dissipation layer, the second heat dissipation layer, and the third heat dissipation layer are respectively fixed on the support layer through the adhesive layer, and
wherein a sum of heights of the first heat dissipation layer and the adhesive layer, a sum of heights of the second heat dissipation layer and the adhesive layer, and a sum of heights of the third heat dissipation layer and the adhesive layer are the same and are not less than the height of the nut.

16. The bendable display device according to claim 14, wherein a side of the third heat dissipation layer facing away from the display panel is provided with a jagged structure.

17. The bendable display device according to claim 11, wherein the connecting member comprises:
a conductive tape,
wherein a first end of the conductive tape is electrically connected to the first heat dissipation layer, and a second end of the conductive tape is electrically connected to the second heat dissipation layer.

18. The bendable display device according to claim 11, wherein the connecting member comprises:
a conductive adhesive,
wherein a material of the support layer is metal, and the conductive adhesive is disposed on both sides of the surface of the support layer facing away from the display panel, and is disposed between the first heat dissipation layer and the support layer and between the second heat dissipation layer and the support layer, respectively.

19. The bendable display device according to claim 11, further comprising:
an adhesive layer,
wherein the adhesive layer is disposed on the surface of the support layer facing away from the display panel, and the first heat dissipation layer and the second heat dissipation layer are respectively fixed on the support layer through the adhesive layer.

20. The bendable display device according to claim 11, wherein a material of the adhesive layer comprises EMBO.

* * * * *